United States Patent
Tachibana et al.

(10) Patent No.: US 7,397,069 B2
(45) Date of Patent: Jul. 8, 2008

(54) SEMICONDUCTOR DEVICE

(75) Inventors: Koichi Tachibana, Kawasaki (JP); Chie Hongo, Yokohama (JP); Hajime Nago, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 11/511,337

(22) Filed: Aug. 29, 2006

(65) Prior Publication Data

US 2007/0096142 A1   May 3, 2007

(30) Foreign Application Priority Data

Aug. 29, 2005   (JP) .............................. 2005-247838

(51) Int. Cl.
   *H01L 29/22* (2006.01)
(52) U.S. Cl. ..................................................... 257/94
(58) Field of Classification Search ............... 257/13, 257/79–103, 918, E51.018–E51.022, E33.001–E33.077, 257/E33.054, E25.028, E25.032, E31.058, 257/E31.063, E31.115, E27.133–E27.139, 257/E27.049, E29.332, E33.046, E29.336, 257/E31.036, E31.087–E31.088, E31.061–E31.062, 257/E29.344, 497–498, 458, 656
   See application file for complete search history.

(56) References Cited

U.S. PATENT DOCUMENTS

| | | | | |
|---|---|---|---|---|
| 6,057,565 A * | 5/2000 | Yoshida et al. ............ | 257/102 |
| 6,064,079 A * | 5/2000 | Yamamoto et al. ........ | 257/101 |
| 6,233,266 B1 * | 5/2001 | Kawasumi .............. | 372/46.01 |
| 6,326,236 B1 * | 12/2001 | Koide et al. ............ | 438/107 |
| 6,515,308 B1 * | 2/2003 | Kneissl et al. ........... | 257/86 |
| 6,555,403 B1 * | 4/2003 | Domen et al. ............ | 438/22 |
| 6,617,606 B2 * | 9/2003 | Nakatsu et al. .......... | 257/14 |
| 6,693,307 B2 * | 2/2004 | Sugawara et al. ........ | 257/103 |
| 6,865,203 B2 | 3/2005 | Yoshida et al. | |
| 7,009,215 B2 * | 3/2006 | D'Evelyn et al. ........ | 257/98 |
| 2002/0039374 A1 * | 4/2002 | Onomura et al. ........ | 372/46 |
| 2002/0053676 A1 * | 5/2002 | Kozaki ................ | 257/88 |
| 2003/0136970 A1 * | 7/2003 | Takeya et al. .......... | 257/90 |
| 2003/0205736 A1 * | 11/2003 | Kozaki ................ | 257/200 |
| 2004/0051107 A1 * | 3/2004 | Nagahama et al. ....... | 257/79 |
| 2004/0124500 A1 * | 7/2004 | Kawagoe .............. | 257/548 |
| 2005/0127391 A1 * | 6/2005 | Yanamoto ............. | 257/103 |
| 2005/0218415 A1 * | 10/2005 | Tanaka et al. .......... | 257/94 |
| 2005/0280022 A1 * | 12/2005 | Ueda et al. ............ | 257/103 |

FOREIGN PATENT DOCUMENTS

| JP | 11-340580 | 12/1999 |
|---|---|---|
| JP | 2004-247563 | 9/2004 |

* cited by examiner

*Primary Examiner*—M. Wilczewski
*Assistant Examiner*—Swapneel Chhaya
(74) *Attorney, Agent, or Firm*—Oblon, Spivak, McClelland, Maier & Neustadt, P.C.

(57) ABSTRACT

A semiconductor device has an active layer, a first semiconductor layer of first conductive type, an overflow prevention layer disposed between the active layer and the first semiconductor layer, which is doped with impurities of first conductive type and which prevents overflow of electrons or holes, a second semiconductor layer of first conductive type disposed at least one of between the active layer and the overflow prevention layer and between the overflow prevention layer and the first semiconductor layer, and an impurity diffusion prevention layer disposed between the first semiconductor layer and the active layer, which has a band gap smaller than those of the overflow prevention layer, the first semiconductor layer and the second semiconductor layer and which prevents diffusion of impurities of first conductive type.

13 Claims, 9 Drawing Sheets

SEMICONDUCTOR DEVICE

CROSS REFERENCE TO RELATED APPLICATIONS

This application is based upon and claims the benefit of priority from the prior Japanese Patent Application No. 2005-247838, filed on Aug. 29, 2005, the entire contents of which are incorporated herein by reference.

BACKGROUND OF THE INVENTION

1. Field of the Invention

The present invention relates to a semiconductor device containing gallium nitride (GaN)-based compound semiconductor.

2. Related Art

Gallium nitride-based (GaN-based) semiconductors have wide band gaps, and the characteristics of GaN-based semiconductors have been used in research and development of high-brightness ultraviolet to blue/green LEDs and violet laser diodes. Further, high-frequency and high-power GaN transistors or the like have been fabricated.

In a GaN-based semiconductor, since an effective mass of an electron or a positive hole is larger than that of a GaAs-based semiconductor, a transparent carrier density of the GaN-based laser is larger than that of GaAs-based laser. Therefore, a threshold current density of a GaN-based laser is inevitably higher than that of a GaAs-based laser. A representative value of the threshold current density of the GaN-based laser is about 1 to 3 kAcm$^{-2}$.

As described above, since a GaN-based laser has a high threshold current density, it is critically important to suppress overflow of carriers (particularly electrons). In a GaN-based laser, a GaAlN layer doped with p-type impurity is often disposed near an active layer to suppress overflow of electrons (Shuji Nakamura et al., "InGaN-Based Multi-Quantum-Well-Structure Laser Diodes", Japanese Journal of Applied Physics, Jan. 15, 1996, volume 35, No. 1B, pp. L74-L76, M. Hansen et al., "Higher efficiency InGaN laser diodes with an improved quantum well capping configuration", Applied Physics Letters, Nov. 25, 2002, volume 81, No. 22, pp. 4275-4277).

However, during crystal growth of an actual device structure, InGaN and GaN/GaAlN used as guide layer materials are grown at different temperatures. The growth temperature of InGaN is about 700 to 800° C., whereas the growth temperature of GaN/GaAlN is 1000 to 1100° C. In other words, after InGaN is grown, the growth is suspended, InGaN undergoes a temperature rising process, and then GaN/GaAlN is grown. It has been found that a defect caused by heat damage is introduced to a crystal growth layer in this temperature rising process. When the layer with such a defect is arranged close to an active layer, the life of the device may decrease. Therefore, in order to achieve a highly reliable device, it is important to locate the layer with such a defect away from the active layer.

When a GaAlN layer doped with p-type impurity is arranged quite close to an active layer, the p-type impurity causes a free carrier loss and, on the contrary, increases a threshold current density. Further, the p-type impurity may diffuse to the active layer. In this case, the loss increases and the threshold current density also increases. Even if the diffusion of p-type impurity to the active layer is suppressed in the initial stage of energization of the laser diode, the impurity may diffuse to the active layer during a life test with a constant optical output, so that the threshold current density may increase and the laser diode may be finally disabled. In this way, the diffusion of p-type impurity to the active layer is a serious problem to the reliability of the device.

SUMMARY OF THE INVENTION

The present invention provides a semiconductor device which can prevent impurity from diffusing to an active layer.

According to one embodiment of the present invention, a semiconductor device, comprising:

an active layer;

a first semiconductor layer of first conductive type;

an overflow prevention layer disposed between the active layer and the first semiconductor layer, which is doped with impurities of first conductive type and which prevents overflow of electrons or holes;

a second semiconductor layer of first conductive type disposed at least one of between the active layer and the overflow prevention layer and between the overflow prevention layer and the first semiconductor layer; and an impurity diffusion prevention layer disposed between the first semiconductor layer and the active layer, which has a band gap smaller than those of the overflow prevention layer, the first semiconductor layer and the second semiconductor layer and which prevents diffusion of impurities of first conductive type, wherein each of the active layer, the overflow prevention layer, the first semiconductor layer, the second semiconductor layer and the impurity diffusion prevention layer are formed of GaN-based compound semiconductor.

According to one embodiment of the present invention, a semiconductor device, comprising:

an active layer;

a first semiconductor layer of first conductive type;

an overflow prevention layer disposed between the active layer and the first semiconductor layer, which is doped with impurities of first conductive type and which prevents overflow of electrons or holes;

a second semiconductor layer of first conductive type which is disposed either of between the active layer and the overflow prevention layer or between the overflow prevention layer and the first semiconductor layer; and an impurity diffusion prevention layer disposed between the overflow prevention layer and the second semiconductor layer, which has a band gap smaller than those of the overflow prevention layer, the first semiconductor layer and the second semiconductor layer and which prevents diffusion of impurities of first conductive type, wherein each of the active layer, the overflow prevention layer, the first semiconductor layer, the second semiconductor layer and the impurity diffusion prevention layer are formed of GaN-based compound semiconductor.

According to one embodiment of the present invention, a semiconductor device, comprising:

an active layer;

a first semiconductor layer of first conductive type;

an overflow prevention layer disposed between the active layer and the first semiconductor layer, which is doped with impurities of first conductive type and which prevents overflow of electrons or holes;

a second semiconductor layer of first conductive type disposed between the overflow prevention layer and the first semiconductor layer;

a third semiconductor layer of first conductive type disposed between the active layer and the overflow prevention layer; and an impurity diffusion prevention layer disposed at least one of between the overflow prevention layer and the second semiconductor layer and between the overflow prevention layer and the third semiconductor layer, which has a band gap smaller than those of the overflow prevention layer, the first semiconductor layer and the second semiconductor layer and which prevents diffusion of impurities of first conductive type, wherein each of the active layer, the overflow prevention layer, the first semiconductor layer, the second semiconductor layer and the impurity diffusion prevention layer are formed of GaN-based compound semiconductor.

DETAILED DESCRIPTION OF THE INVENTION

Hereafter, a receiver and a receiving method according to the present invention will be described more specifically with reference to the drawings.

Exemplary embodiments of the present invention will now be described with reference to the accompanying drawings.

Embodiment 1

Figure 1:
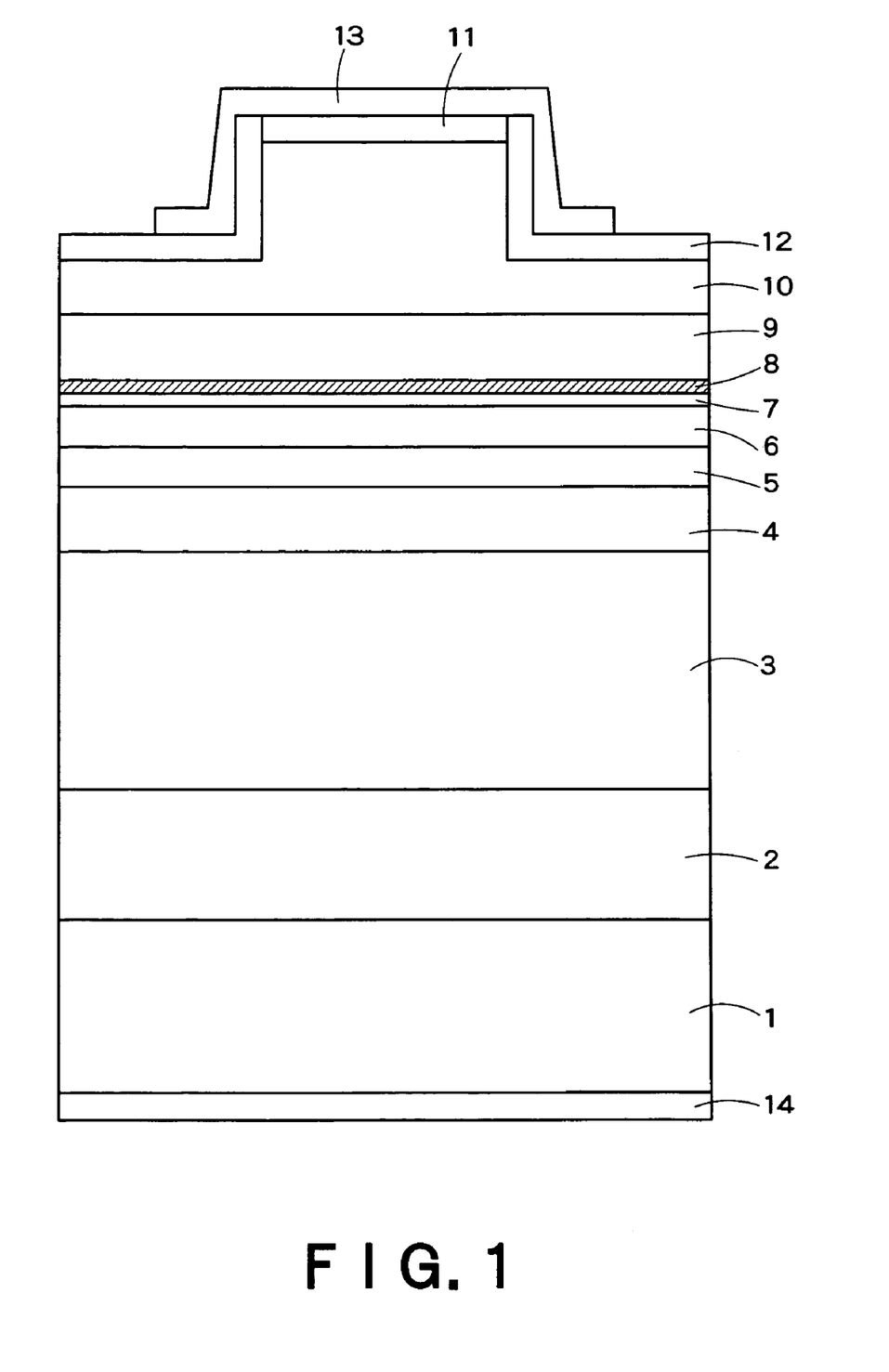
FIG. 1 is a sectional view showing a semiconductor device according to Embodiment 1 of the present invention.

FIG. 1 is a sectional view of a semiconductor device according to Embodiment 1 of the present invention. FIG. 1 shows a semiconductor light-emitting device, to be specific, the cross-sectional structure of a laser diode. The laser diode shown in FIG. 1 includes an n-type GaN buffer layer 2 formed on an n-type GaN substrate 1, an n-type clad layer 3 formed thereon, an n-type guide layer 4 formed thereon, an active layer 5 formed thereon, a p-type first guide layer 6 formed thereon, a $Ga_xAl_{1-x}N$ ($0<x\leq1$) layer (overflow prevention layer) 7 formed thereon, an $In_yGa_{1-y}N$ ($0<y\leq1$) layer (impurity diffusion prevention layer) 8 formed thereon, a p-type GaN second guide layer 9 formed thereon, a p-type clad layer 10 formed thereon, and a p-type contact layer 11 formed thereon. The overflow prevention layer can be extended more generally to $In_{1-x-y}Ga_xAl_yN$ ($0\leq x<1$, $0<y\leq1$).

The composition ratio of In in the impurity diffusion prevention layer 8 is set higher than those of the overflow prevention layer 7, the guide layers 6 and 9 and the p-type clad layer 10. As a guide of diffusion of impurity (described later), the composition ratio of In in the impurity diffusion prevention layer 8 is set at 2% to 10%, preferably 3% to 8%, and the composition ratio of In in the overflow prevention layer 7 and the guide layers 6 and 9 is set at 2% or less. Generally, as the composition ratio of In increases, the index of refraction increases and the band gap decreases. When the composition ratio of In is low in the impurity diffusion prevention layer 8, it is difficult to prevent diffusion of impurity. In view of luminous efficiency, it is desirable that the composition ratio of In in the impurity diffusion prevention layer 8 is lower than that of the quantum well layer of the active layer.

The p-type clad layer 10 has a convex portion. The p-type GaN contact layer 11 is formed on the top surface of the convex portion, and an insulating layer 12 is formed on the side walls of the convex portion and a surface of the p-type clad layer 10 except for the convex portion. A p-type electrode 13 is formed on the p-type contact layer 11 and an n-type electrode 14 is formed on the backside of the n-type GaN substrate 1.

The laser diode of FIG. 1 has the impurity diffusion prevention layer 8 between the overflow prevention layer 7 and the p-type GaN second guide layer 9. The impurity diffusion prevention layer 8 absorbs p-type impurity which is present in the p-type GaN guide layer 9 and the p-type clad layer 10 and so on, so that the p-type impurity does not diffuse to the active layer. Although diffusion of impurity can be sufficiently prevented by disposing the impurity diffusion prevention layer 8 close to the p-type clad layer 10, diffusion of impurity can be further prevented by disposing the impurity diffusion prevention layer 8 close to the active layer 5. The reason is that it is possible to prevent diffusion of p-type impurity included in as many as possible of one or more p-type semiconductor layers between the active layer 5 and the p-type clad layer 10. However, when the impurity diffusion prevention layer 8 is in contact with the active layer 5, a quantum well layer of the active layer 5 has a smaller band gap than the impurity diffusion prevention layer 8. Thus the p-type impurity may not be sufficiently absorbed by the impurity diffusion prevention layer 8 but diffused to the active layer 5, which is not desirable.

Figure 2:
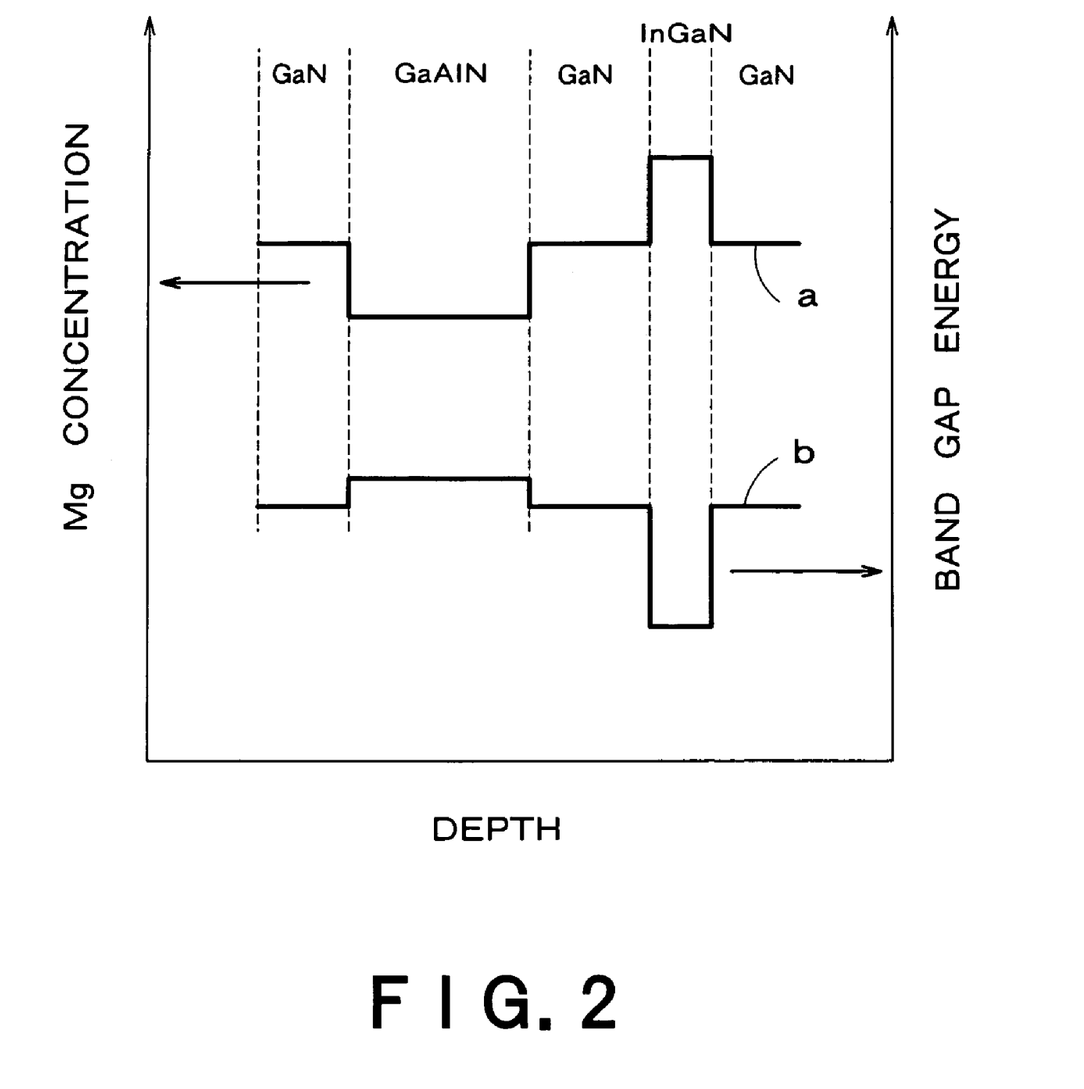
FIG. 2 is a diagram showing the relationship between a depth of a laminated film and a Mg concentration and the relationship between a depth and band gap energy.

The inventor examined the doping profile of p-type impurity (for example, Mg) in a laminated film made of GaN, GaAlN and InGaN by using secondary ion-microprobe mass spectrometry (SIMS). As a result, it was found that in spite of a constant doping concentration, InGaN has the highest Mg concentration even in consideration of the matrix effect of SIMS. FIG. 2 shows this result. In chart "a" of FIG. 2, the horizontal axis represents a depth position of the laminated film and the vertical axis represents a concentration of Mg. In chart "b", the horizontal axis represents a depth position of the laminated film and the vertical axis represents band gap energy.

As indicated by chart "a" of FIG. 2, the impurity diffusion prevention layer 8 has the highest Mg concentration. Further, chart "b" indicates that the impurity diffusion prevention layer 8 has the lowest band gap energy.

The reason why InGaN has a high Mg concentration is that InGaN is larger in lattice constant than GaN and GaIN (strictly saying, a lattice constant is large in the c-axis direction) and Mg is easily extracted into the film.

As shown in FIG. 2, a Mg concentration and band gap energy are correlated with each other in each layer of the laminated film. Therefore also in the laser diode of FIG. 1, the $In_yGa_{1-y}N$ impurity diffusion prevention layer 8 is made of a material having lower band gap energy than the overflow prevention layer 7 and the p-type GaN second guide layer 9 which are disposed on the respective sides of the impurity diffusion prevention layer 8, so that p-type impurity contained in the p-type GaN second guide layer 9, the p-type clad layer 10, and so on can be accumulated in the impurity diffusion prevention layer 8. In other words, the lattice constant of the impurity diffusion prevention layer 8 in the c-axis direction is made larger than those of the overflow prevention layer 7 and the p-type GaN second guide layer 9 in the c-axis direction, the layers 7 and 9 being disposed on the respective sides of the impurity diffusion prevention layer 8. Thus p-type impurity can be accumulated in the impurity diffusion prevention layer 8.

In the present embodiment, the impurity diffusion prevention layer 8 including an $In_yGa_{1-y}N$ layer having a smaller band gap is disposed on the overflow prevention layer 7 doped with p-type impurity and the p-type impurity is accumulated in the impurity diffusion prevention layer 8, so that the p-type impurity is not diffused to the active layer.

FIGS. 3 and 4 are process drawings showing the manufacturing process of the laser diode shown in FIG. 1. First, on the n-type GaN substrate 1, the crystal of the n-type GaN buffer layer 2 doped with n-type impurity is grown (FIG. 3(A)). For example, Metal Organic Chemical Vapor Deposition (MOCVD) is used for the crystal growth. Further, Molecular Beam Epitaxy (MBE) may be used for the crystal growth. The n-type impurity may be Si or Ge. Si is used in the present embodiment.

Figure 3A:
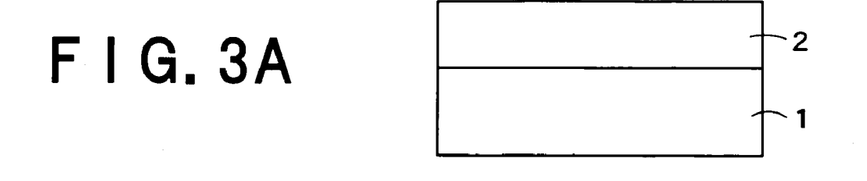
FIGS. 3A-3D are process drawings showing the manufacturing process of a laser diode shown in FIG. 1.
Figure 3B:
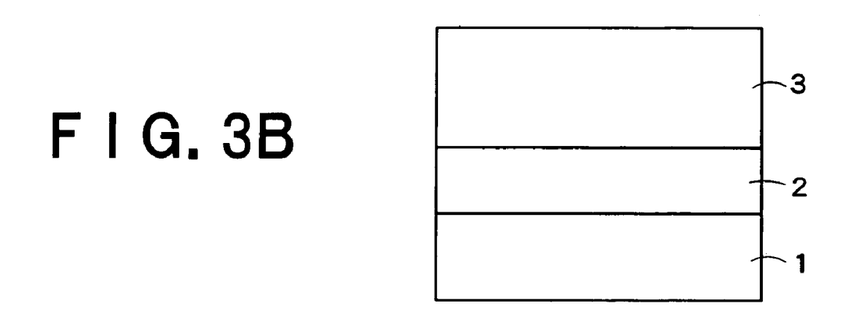

And then the superlattice n-type clad layer 3 including an undoped $Ga_{0.9}Al_{0.1}N$ layer and a GaN layer doped with an n-type impurity of about $1\times10^{18}$ cm$^{-3}$ is grown on the n-type GaN buffer layer 2 (FIG. 3(B)). The material of the n-type clad layer 3 is not particularly limited. For example, a thick film of $Ga_{0.95}Al_{0.05}N$ may be used. Alternatively both of the $Ga_{0.9}Al_{0.1}N$ layer and the GaN layer may be doped with n-type impurity to form the n-type clad layer 3.

And then the n-type guide layer 4 made of GaN with a thickness of about 0.1 μm is grown on the n-type clad layer 3. The n-type guide layer 4 is doped with n-type impurity of about $1\times10^{18}$ cm$^{-3}$. Alternatively the n-type guide layer 4 may be made of $In_{0.01}Ga_{0.99}N$ with a thickness of about 0.1 μm. The n-type GaN buffer layer 2, the n-type clad layer 3, and the n-type guide layer 4 are grown at 1000 to 1100° C.

Figure 3C:
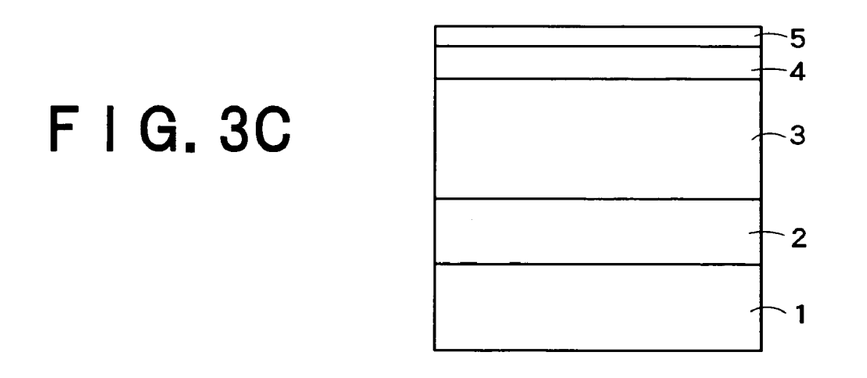

And then on the n-type guide layer 4, the active layer 5 having a multiple quantum well (MQW) structure is formed (FIG. 3(C)). In this structure, quantum well layers each of which includes an undoped $In_{0.1}Ga_{0.9}N$ layer having a thickness of about 3.5 nm and barrier layers each of which includes an undoped $In_{0.01}Ga_{0.99}N$ layer having a thickness of about 7 nm are alternately stacked such that the barrier layers are disposed on both sides of the quantum well. In this case, the growth temperature is 700 to 800° C.

And then the p-type first guide layer 6 made of $In_{0.005}Ga_{0.995}N$ is grown on the active layer 5. The p-type first guide layer 6 only requires a thickness of about 90 nm. The p-type first guide layer 6 may be undoped or doped with about $1\times10^{17}$ cm$^{-3}$ to about $5\times10^{18}$ cm$^{-3}$ of Mg. Mg is a p-type impurity. When the n-type guide layer 5 disposed under the active layer is made of GaN or $In_{x1}Ga_{1-x1}N$ (0<x1<1) and the active layer has a single or multiple quantum well structure including a quantum well containing $In_{x2}Ga_{1-x2}N$ (0<x2≦1) and a barrier layer containing $In_{x3}Ga_{1-x3}N$ (0≦x3<1, x2>x3), the p-type first guide layer 6 is made of $In_{x4}Ga_{1-x4}N$ (0≦x4<1, x3>x4).

And then a $Ga_{0.8}Al_{0.2}N$ layer having a thickness of about 10 nm is grown on the p-type first guide layer 6. The $Ga_{0.8}Al_{0.2}N$ layer is doped with about $4\times10^{18}$ cm$^{-3}$ to about $5\times10^{19}$ cm$^{-3}$ of Mg. The $Ga_{0.8}Al_{0.2}N$ layer is provided to prevent overflow of electrons and thus also called the overflow prevention layer 7. The p-type first guide layer 6 and the overflow prevention layer 7 are grown at 1000 to 1100° C.

Figure 3D:
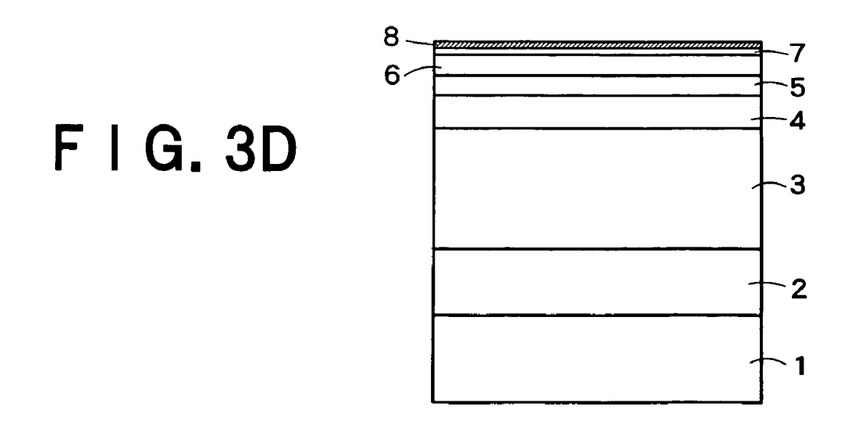

And then the impurity diffusion prevention layer 8 made of $In_yGa_{1-y}N$ (0<y≦1) is grown on the overflow prevention layer 7 (FIG. 3(D)). Composition y of In represents, for example, y=0.02 with a thickness of 3 nm. The thickness is set at, for example, 1 to 15 nm and preferably set at 1 nm to 10 nm. A small thickness makes it difficult to obtain the effect of preventing impurity diffusion, and a large thickness changes the light intensity distribution, which is not desirable. The impurity diffusion prevention layer 8 is grown preferably at 700° C. to 800° C. In the case of a low In content (for example, 3% or less), the impurity diffusion prevention layer 8 may be grown at 1000 to 1100° C. The impurity diffusion prevention layer 8 may be doped with about $1\times10^{17}$ cm$^{-3}$ to about $1\times10^{19}$ cm$^{-3}$ of Mg.

And then the p-type GaN second guide layer 9 doped with about $2\times10^{18}$ cm$^{-3}$ to about $5\times10^{19}$ cm$^{-3}$ of Mg is grown on the $In_yGa_{1-y}N$ layer. This layer is, for example, 0.05 μm in thickness. Subsequently the p-type clad layer 10 having a superlattice structure is grown on the p-type GaN second guide layer 9. The superlattice structure includes an undoped $Ga_{0.9}Al_{0.1}N$ layer and GaN doped with about $1\times10^{19}$ cm$^{-3}$ to about $5\times10^{19}$ cm$^{-3}$ of Mg. The material of the p-type clad layer 10 is not particularly limited. The p-type clad layer 10 may be a thick film (about 0.6 μm in thickness) doped with p-type impurity including, for example, $Ga_{0.95}Al_{0.05}N$. Alternatively both of $Ga_{0.9}Al_{0.1}N$ and GaN may be doped with p-type impurity. And then the p-type contact layer 11 including a GaN layer doped with p-type impurity with a thickness of 0.1 μm is formed on the p-type clad layer 10 (FIG. 4(A)). Instead of the GaN layer, an InGaAlN layer doped with p-type impurity may be used. The p-type GaN second guide layer 9, the p-type clad layer 10, and the p-type contact layer 11 are grown at 1000° C. to 1100° C.

Figure 4A:
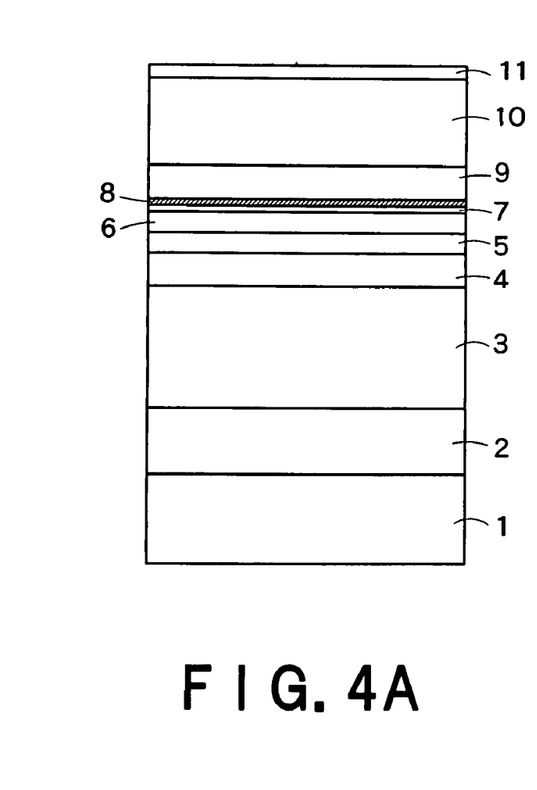
FIGS. 4A-4C are process drawings following FIG. 3.
Figure 4B:
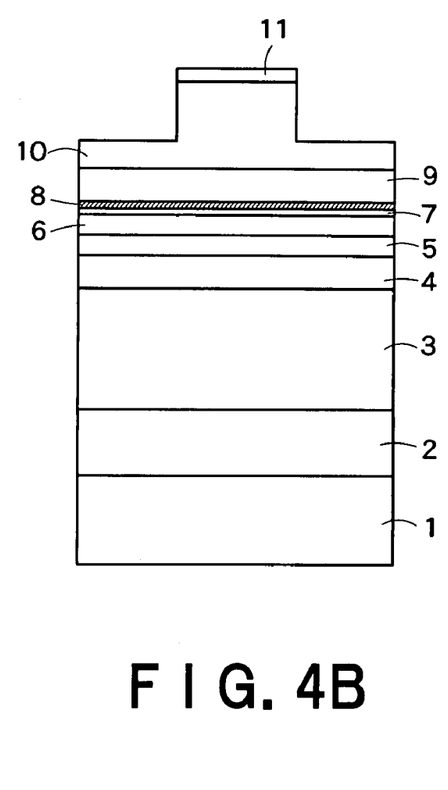
Figure 4C:
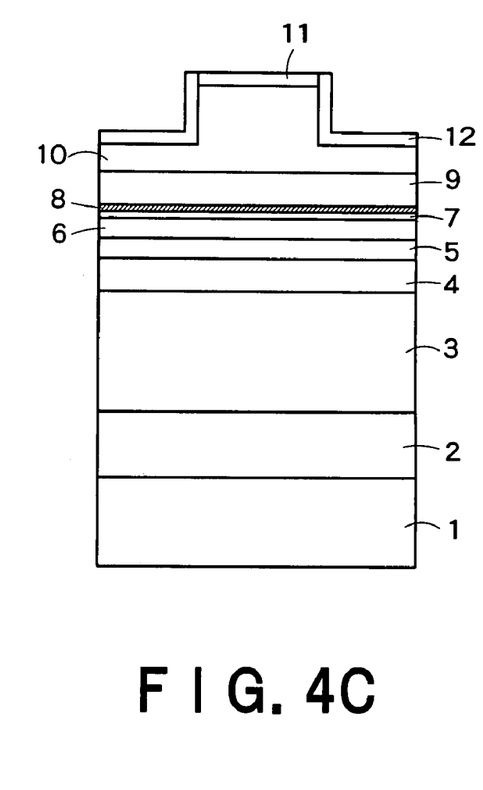

A device process is performed on a wafer where crystal has been grown according to the process of FIGS. 3 to 4(A), so that a laser diode is finally formed. The p-type contact layer 11 and the p-type clad layer 10 are partially removed by lithography and dry etching to form a ridge structure having a convex portion (FIG. 4(B)). Further, the insulating layer 12 is formed on the side walls of the convex portion and a surface of the p-type clad layer 10 except for the convex portion (FIG. 4(C)).

And then the p-type electrode 13 is formed on the insulating layer 12 and the p-type GaN contact layer 11 doped with about $3\times10^{19}$ cm$^{-3}$ to about $1\times10^{22}$ cm$^{-3}$ of Mg, and the n-type electrode 14 is formed on the backside of the n-GaN substrate.

The end face of the laser diode is formed by cleavage and a coating with a high reflectivity is applied on a surface opposite from the light extracting surface.

A convex laminated structure including the p-type clad layer 10 and the p-type GaN contact layer 11 extends in the vertical direction of the drawing and acts as a resonator.

The shape of the convex laminated structure is not limited to a rectangle having a vertical side wall in the cross section of FIG. 1. The structure may have a trapezoidal convex portion with a slope of a mesa. The p-type contact layer 11 is about 2 μm in width (ridge width) and the resonator length is set at, for example, 600 μm.

On the side walls of the convex portion and the surface of the p-type clad layer 10 except for the convex portion, a current block layer including the insulating layer 12 is formed with the convex portion inserted in the insulating layer 12. The current block layer controls the transverse mode of the laser diode. Although the thickness of the current block layer can be arbitrarily selected according to a design, the thickness is preferably set at about 0.3 μm to 0.8 μm, for example, about 0.5 μm.

The material of the current block layer includes, for example, a high-resistivity semiconductor film such as an AlN film and a $Ga_{0.8}Al_{0.2}N$ film, a semiconductor film irradiated with proton, a silicon oxide film ($SiO_2$ film), and a multilayer film made up of a $SiO_2$ film and a $ZrO_2$ film. In other words, various materials can be used for the current block layer as long as the materials are lower in the index of refraction than a nitride III-V compound semiconductor used for the active layer 5.

Moreover, the laser diode of the present embodiment does not always have to have a ridge waveguide laser structure. For example, in the case of an embedded laser structure, an n-type semiconductor layer such as n-type GaN and n-type GaAlN may be used, instead of an insulating film, as the current block layer by pn junction isolation.

The p-type electrode 13 including, for example, a composite film of palladium-platinum-gold (Pd/Pt/Au) is formed on the p-type GaN contact layer 11. For example, a Pd film is 0.05 μm in thickness, a Pt film is 0.05 μm in thickness, and an Au film is 1.0 μm in thickness.

On the other hand, the n-type electrode 14 including, for example, a composite film of titanium-platinum-gold (Ti/Pt/Au) is formed on the backside of the n-type GaN substrate 1. For the n-type electrode 14, for example, a Ti film having a thickness of 0.05 μm, a Pt film having a thickness of 0.05 μm, and an Au film having a thickness of 1.0 μm are used.

The laser diode manufactured by the manufacturing process of FIGS. 3 and 4 has a threshold current of 35 mA on the average in a current-optical output characteristic. Also in a laser diode where the impurity diffusion prevention layer 8 is not provided on the overflow prevention layer 7, the threshold current is about 35 mA on the average. Therefore it is understood that the presence or absence of the impurity diffusion prevention layer 8 does not cause a different initial characteristic of the laser diode.

The inventor conducted an energization test in which a life is measured with a constant optical output. In this conduction test, the laser diode was caused to continuously oscillate with an optical output of 50 mW and an operating temperature of 75° C. to examine the rate of increase of the operating current. A time period during which the operating current increases from the initial value by 20% is defined as the life of the laser diode. The life of the laser diode of FIG. 1 was measured according to this definition, so that the life was estimated to be 1000 hours or longer according to a change in the rate of increase. On the other hand, the life of the laser diode not having the impurity diffusion prevention layer 8 was estimated to be 200 to 300 hours.

The cause of the difference in life will be discussed below. When the impurity diffusion prevention layer 8 is omitted, during the energization test, p-type impurity (for example, Mg) in the p-type clad layer 10 and the p-type second guide layer 9 gradually starts diffusing to the active layer 5 containing less impurity. The p-type impurity diffused to the active layer 5 causes a free carrier loss, and thus the threshold current increases in the laser diode. Further, slope efficiency which indicates a ratio of a change in optical output to a change in current at the threshold current or higher decreases. Therefore the operating current increases when the optical output is kept constant.

When the impurity diffusion prevention layer 8 is provided as in the present embodiment, p-type impurity is accumulated in the impurity diffusion prevention layer 8, thereby suppressing the diffusion of the p-type impurity to the active layer 5. It is thus possible to provide a laser diode with a long life and high reliability.

Figure 5:
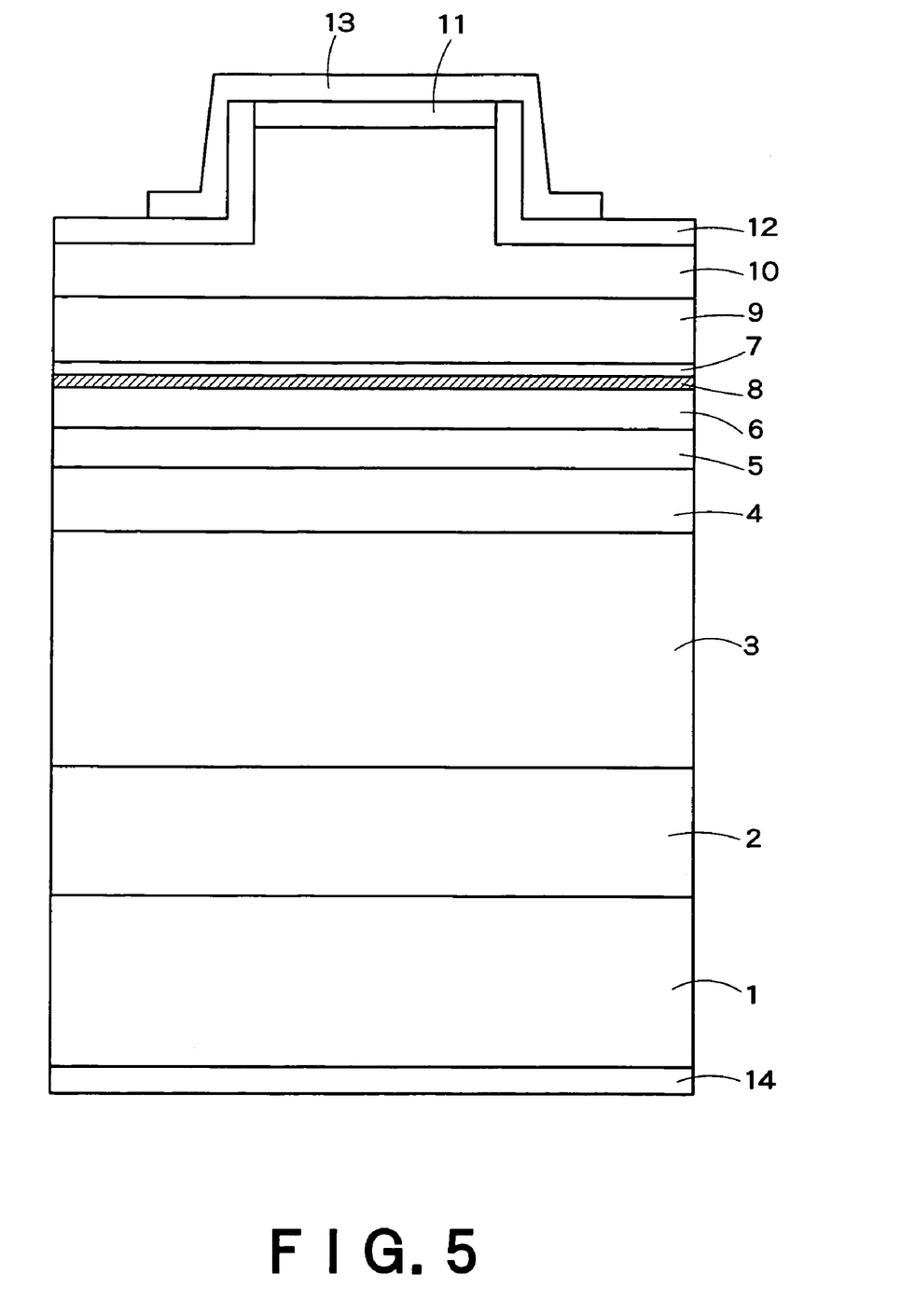
FIG. 5 is a sectional view showing a semiconductor device in which an impurity diffusion prevention layer 8 is interposed between an overflow prevention layer 7 and a p-type first guide layer 6.

While the impurity diffusion prevention layer 8 is interposed between the overflow prevention layer 7 and the p-type GaN second guide layer 9 in the laser diode of FIG. 1, the impurity diffusion prevention layer 8 may be interposed between the overflow prevention layer 7 and the p-type first guide layer 6 as shown in FIG. 5. Also in FIG. 5, p-type impurity in the overflow prevention layer 7 can be positively accumulated in the impurity diffusion prevention layer 8.

As described above, the impurity diffusion prevention layer 8 made of $In_yGa_{1-y}N$ is disposed near the active layer 5 in the present embodiment, and thus p-type impurity in the p-type clad layer 10 or the p-type second guide layer 9 can be accumulated in the impurity diffusion prevention layer 8 and does not diffuse to the active layer 5. It is thus possible to increase the life of the laser diode and improve reliability.

Embodiment 2

Embodiment 2 is different from Embodiment 1 in the structure of the laser diode.

Figure 6:
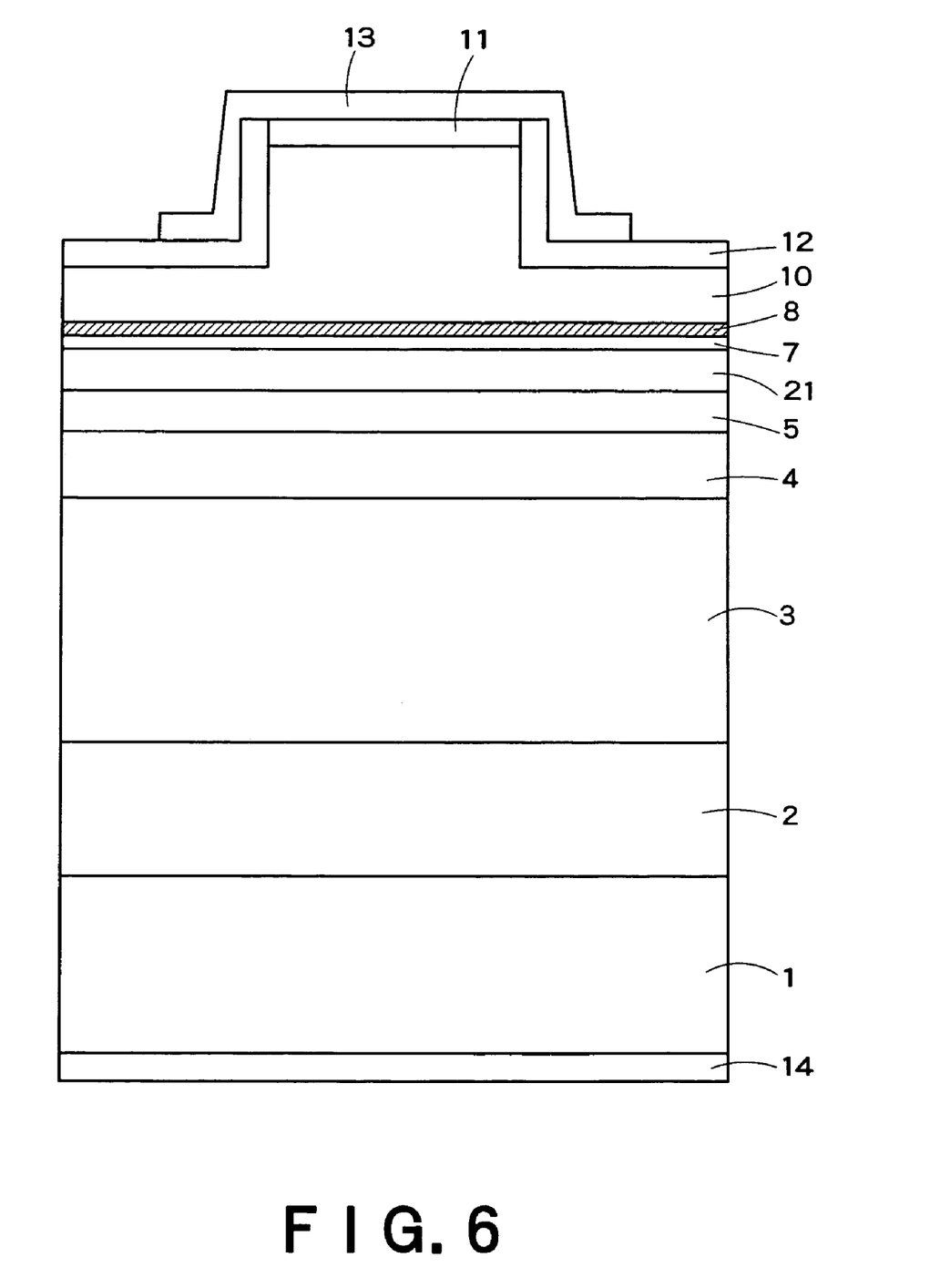
FIG. 6 is a sectional view showing a laser diode of Embodiment 2.

FIG. 6 is a sectional view showing the laser diode of Embodiment 2. The laser diode of FIG. 6 has a p-type GaN guide layer 21 which is a single layer combining the p-type first guide layer 6 and the p-type GaN second guide layer 9 of FIG. 1. The guide layer is interposed between an active layer 5 and an overflow prevention layer 7. To be specific, the laser diode of FIG. 6 includes an n-type GaN buffer layer 2 formed on an n-type GaN substrate 1, an n-type clad layer 3 formed thereon, an n-type guide layer 4 formed thereon, the active layer 5 formed thereon, the p-type GaN guide layer 21 formed thereon, the $Ga_{0.8}Al_{0.2}N$ layer (overflow prevention layer 7) formed thereon, an $In_yGa_{1-y}N$ (0<y≦1) layer (impurity diffusion prevention layer 8) formed thereon, and a p-type clad layer 10 formed thereon.

In the laser diode of FIG. 6, p-type impurity in the p-type clad layer 10 can be accumulated in the impurity diffusion prevention layer 8, and thus it is possible to prevent the p-type impurity from diffusing to the active layer 5.

In FIG. 6, the impurity diffusion prevention layer 8 is interposed between the overflow prevention layer 7 and the p-type clad layer 10. The impurity diffusion prevention layer 8 may be interposed between the p-type GaN guide layer 21 and the overflow prevention layer 7 as shown in FIG. 7.

Figure 7:
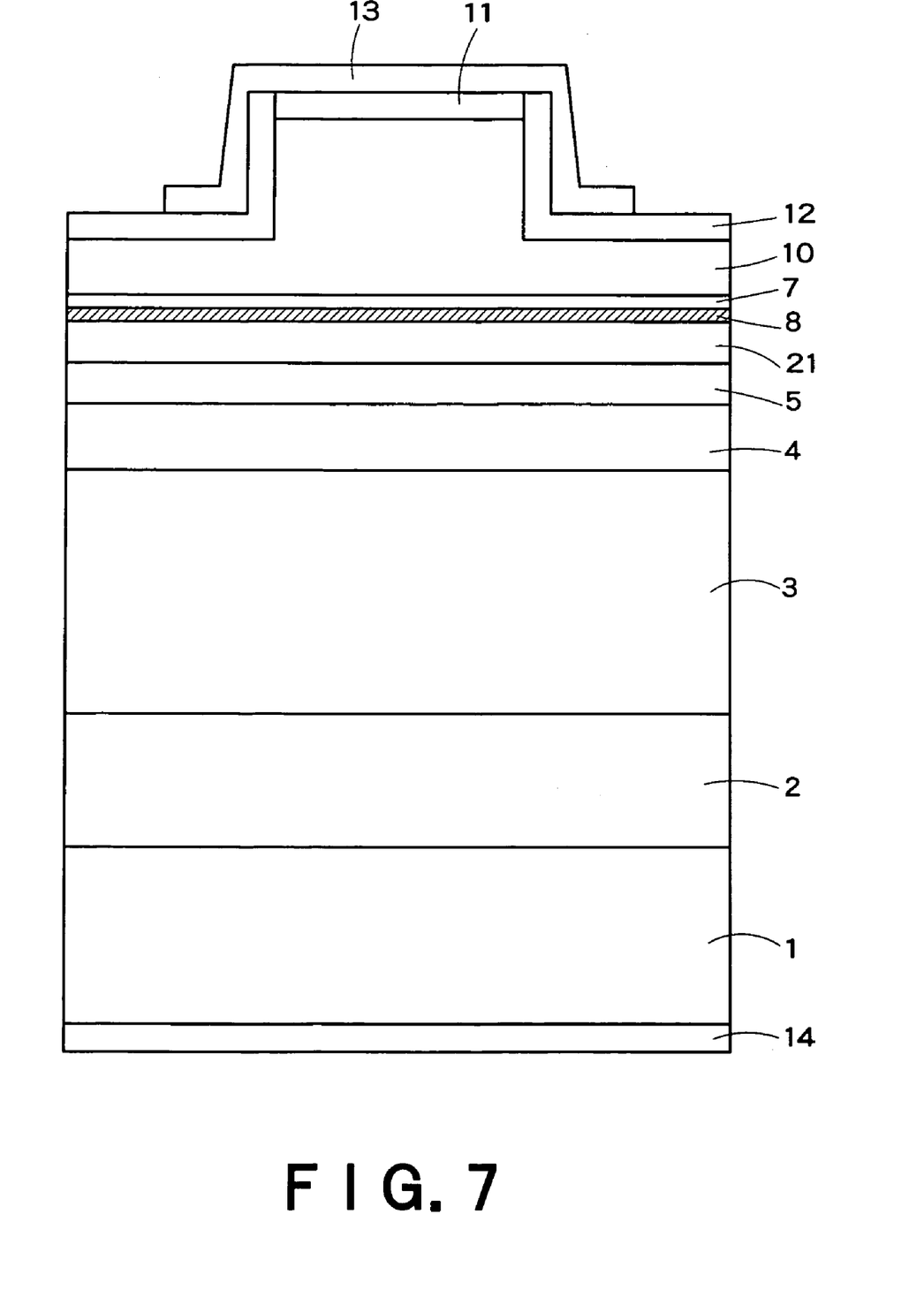
FIG. 7 is a sectional view showing a laser diode in which an impurity diffusion prevention layer 8 is interposed between a p-type GaN guide layer 21 and an overflow prevention layer 7.

In the laser diode of FIG. 7, p-type impurity in the overflow prevention layer 7 as well as the p-type clad layer 10 can be accumulated in the impurity diffusion prevention layer 8.

Figure 8:
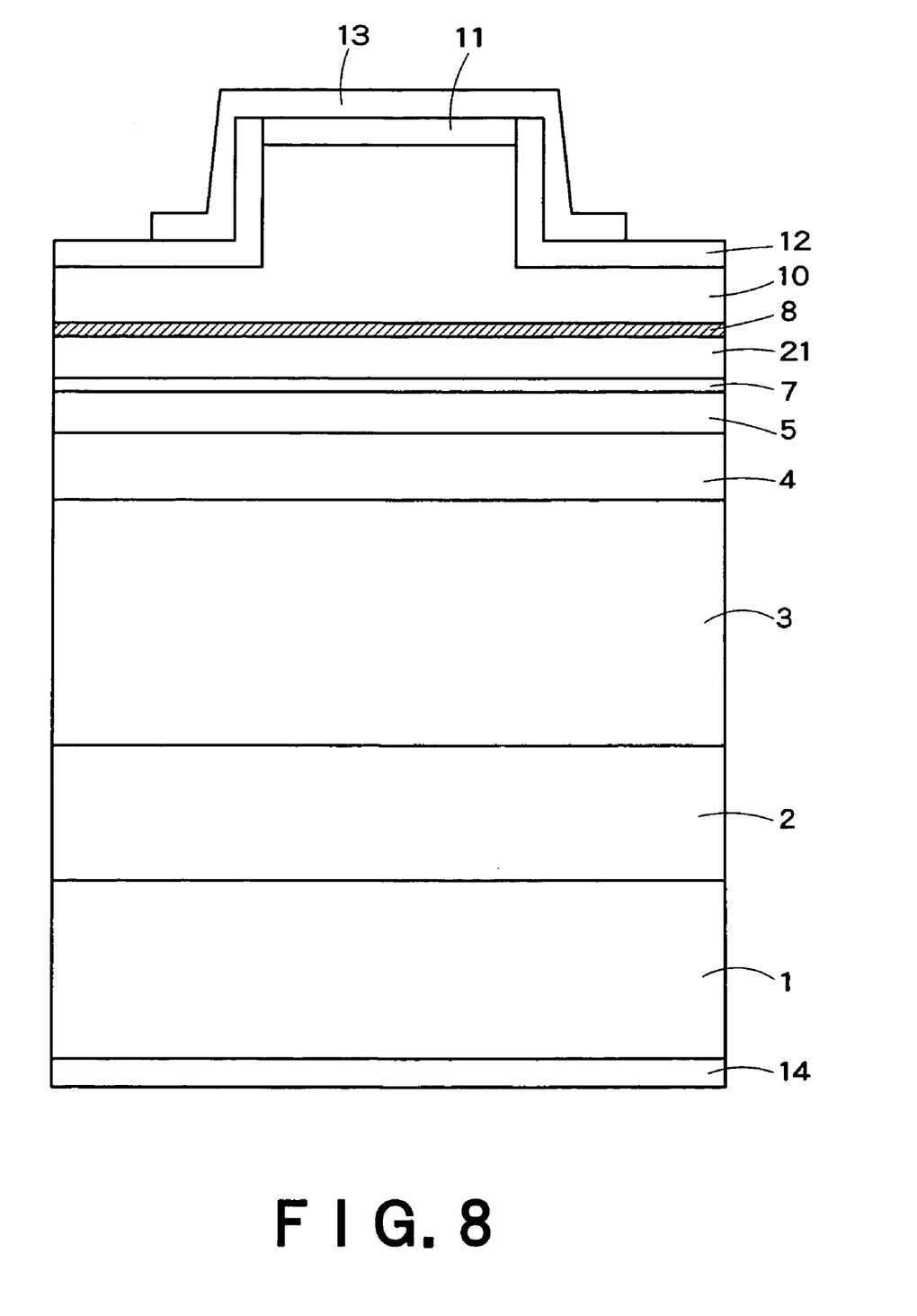
FIG. 8 is a sectional view showing a laser diode in which the impurity diffusion prevention layer 8 is interposed between a p-type clad layer 10 and the p-type GaN guide layer 21.
Figure 9:
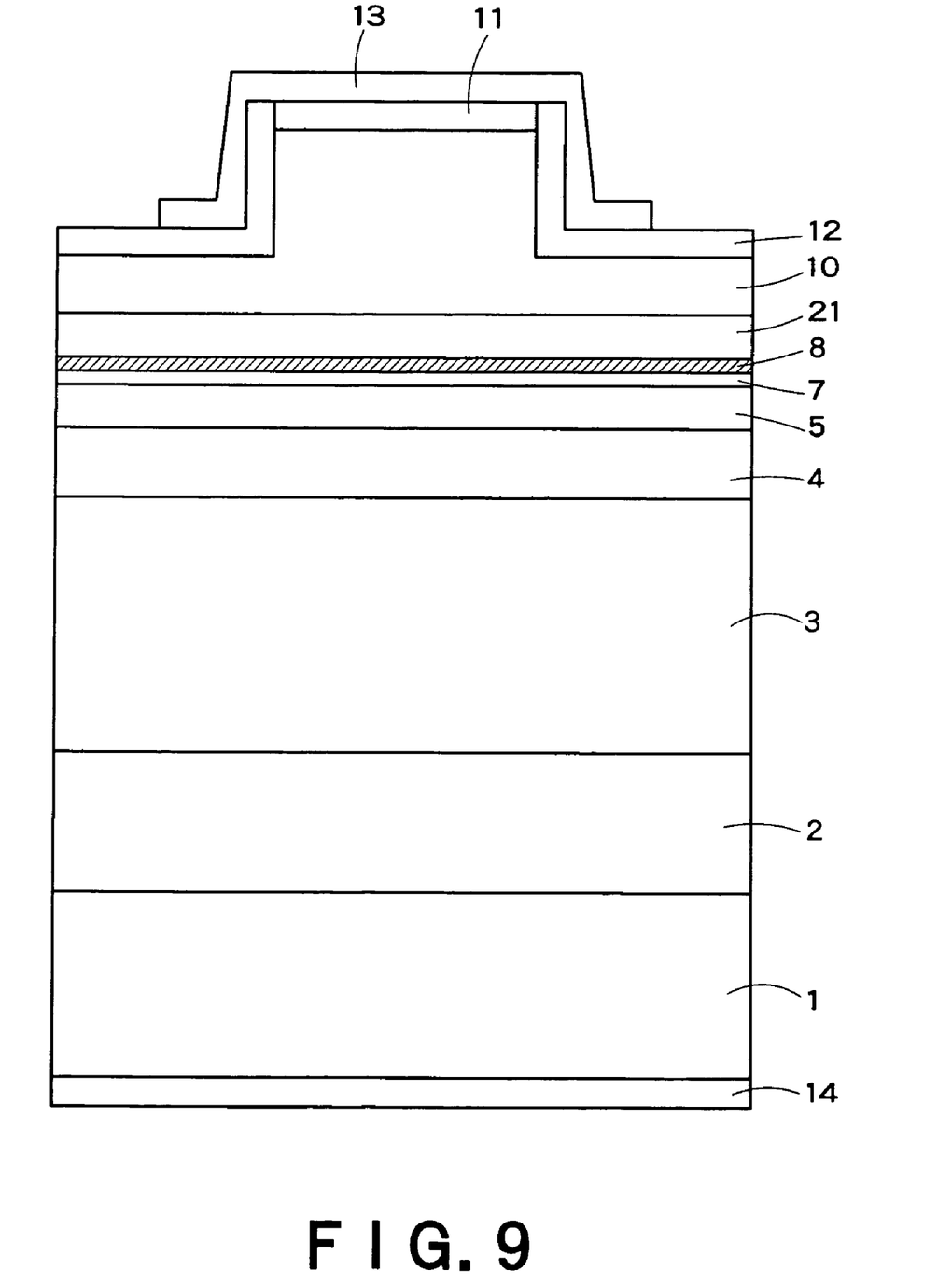
FIG. 9 is a sectional view showing a laser diode in which the impurity diffusion prevention layer 8 is interposed between the p-type GaN guide layer 21 and the overflow prevention layer 7.

In the laser diodes of FIGS. 6 and 7, the order of stacking the p-type GaN guide layer 21 and the overflow prevention layer 7 may be reversed. In this case, a laser diode shown in FIG. 8 or 9 is obtained. In the laser diode of FIG. 8, the impurity diffusion prevention layer 8 is interposed between the p-type clad layer 10 and the p-type GaN guide layer 21. In the diode of FIG. 9, the impurity diffusion prevention layer 8 is interposed between the p-type GaN guide layer 21 and the overflow prevention layer 7.

As described above, in any of these structures shown in FIGS. 6 to 9, p-type impurity can be accumulated in the impurity diffusion prevention layer 8. It is thus possible to prevent p-type impurity from diffusing to the active layer and increase the life of the laser diode.

In Embodiments 1 and 2, the p-type impurity is Mg, Zn or the like may be used.

In Embodiments 1 and 2, there have been described examples in which the laser diode includes the impurity diffusion prevention layer 8. The present invention is applicable not only to a laser diode but also an optical device such as a light-emitting diode and a photodetector and an electronic device such as a transistor (for example, a heterojunction bipolar transistor (HBT)).

Further, in the embodiments, there have been described examples in which p-type impurity is accumulated in the impurity diffusion prevention layer 8. When an n-type guide layer and an overflow prevention layer for preventing overflow of a positive hole doped with n-type impurity are provided, the n-type impurity may be accumulated in an impurity diffusion prevention layer formed adjacent to these layers.

What is claimed is:

1. A semiconductor device, comprising:
an active layer;
a first semiconductor layer of first conductive type;
an overflow prevention layer disposed between the active layer and the first semiconductor layer, which is doped with impurities of first conductive type and which prevents overflow of electrons or holes;
a second semiconductor layer of first conductive type which is disposed either of between the active layer and the overflow prevention layer or between the overflow prevention layer and the first semiconductor layer; and
an impurity diffusion prevention layer disposed between the overflow prevention layer and the second semiconductor layer, which has a band gap smaller than those of the overflow prevention layer, the first semiconductor layer and the second semiconductor layer and which prevents diffusion of impurities of first conductive type,
wherein each of the active layer, the overflow prevention layer, the first semiconductor layer, the second semiconductor layer and the impurity diffusion prevention layer are formed of GaN-based compound semiconductor.

2. The semiconductor device according to claim 1,
wherein the second semiconductor layer is disposed between the active layer and the overflow prevention layer; and
the impurity diffusion prevention layer is disposed between the second semiconductor layer and the overflow prevention layer.

3. The semiconductor device according to claim 1,
wherein the impurity diffusion prevention layer includes In; and
a composition ratio of In in the impurity diffusion prevention layer is higher than those of the overflow prevention layer, the first semiconductor layer and the second semiconductor layer.

4. The semiconductor device according to claim 1,
wherein the active layer emits a light with a predetermined wavelength;
the first conductive type is p-type;
the first semiconductor layer is used as a p-type clad layer;
the second semiconductor layer is used as a p-type guide layer; and
the overflow prevention layer prevents overflow of electrons.

5. The semiconductor device according to claim 4, further comprising:

an n-type guide layer disposed on a side of the active layer opposite from the p-type guide layer, which includes GaN or $In_{x1}Ga_{1-x1}N$ ($0<x1<1$);
wherein the active layer includes a single or multiple quantum well structure having $In_{x2}Ga_{1-x2}N$ ($0<x2\leq1$) and a barrier layer having $In_{x3}Ga_{1-x3}N$ ($0\leq x3<1$, $x2>x3$); and
the p-guide layer has $In_{x4}Ga_{1-x4}N$ ($0\leq x4<1$, $x3>x4$).

6. The semiconductor device according to claim 1,
wherein the overflow prevention layer has a $Ga_{1-y}Al_yN$ layer ($0<y\leq1$).

7. A semiconductor device, comprising:
an active layer;
a first semiconductor layer of first conductive type;
an overflow prevention layer disposed between the active layer and the first semiconductor layer, which is doped with impurities of first conductive type and which prevents overflow of electrons or holes;
a second semiconductor layer of first conductive type disposed between the overflow prevention layer and the first semiconductor layer;
a third semiconductor layer of first conductive type disposed between the active layer and the overflow prevention layer; and
an impurity diffusion prevention layer disposed at least one of between the overflow prevention layer and the second semiconductor layer and between the overflow prevention layer and the third semiconductor layer, which has a band gap smaller than those of the overflow prevention layer, the first semiconductor layer, the second semiconductor layer and the third semiconductor layer and which prevents diffusion of impurities of first conductive type,
wherein each of the active layer, the overflow prevention layer, the first semiconductor layer, the second semiconductor layer, the third semiconductor layer and the impurity diffusion prevention layer are formed of GaN-based compound semiconductor.

8. The semiconductor device according to claim 7,
wherein the impurity diffusion prevention layer is disposed between the second semiconductor layer and the overflow prevention layer.

9. The semiconductor device according to claim 7,
wherein the impurity diffusion prevention layer is disposed between the third semiconductor layer and the overflow prevention layer.

10. The semiconductor device according to claim 7,
wherein the impurity diffusion prevention layer includes In; and
a composition ratio of In in the impurity diffusion prevention layer is higher than of those of the overflow prevention layer, the first semiconductor layer, the second semiconductor layer and the third semiconductor layer.

11. The semiconductor device according to claim 7,
wherein the active layer emits a light with a predetermined wavelength;
the first conductive type is p-type;
the first semiconductor layer is used as a p-type clad layer;
each of the second and third semiconductor layers is used as a p-type guide layer; and
the overflow prevention layer prevents overflow of electrons.

12. The semiconductor device according to claim 7, further comprising:
an n-type guide layer disposed on a side of the active layer opposite from the p-type guide layer, which includes GaN or $In_{x1}Ga_{1-x1}N$ ($0<x1<1$);

wherein the active layer includes a single or multiple quantum well structure having $In_{x2}Ga_{1-x2}N$ ($0<x2\leqq1$) and a barrier layer having $In_{x3}Ga_{1-x3}N$ ($0\leqq x3<1$, $x2>x3$); and the p-guide layer has $In_{x4}Ga_{1-x4}N$ ($0\leqq x4<1$, $x3>x4$).

13. The semiconductor device according to claim 7, wherein the overflow prevention layer has a $Ga_{1-y}Al_yN$ layer ($0<y\leqq1$).

* * * * *